United States Patent
Vakilian

(10) Patent No.: US 6,236,271 B1
(45) Date of Patent: May 22, 2001

(54) MULTI-LAYER CARRIER MODULE FOR POWER AMPLIFIER SYSTEMS WITHIN A DIGITAL CELLULAR TELEPHONE

(75) Inventor: Nooshin D. Vakilian, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 08/941,488

(22) Filed: Sep. 30, 1997

(51) Int. Cl.[7] ................ H03G 3/30; H05K 1/14
(52) U.S. Cl. .............. 330/279; 330/66; 361/736
(58) Field of Search ............... 330/65, 66, 279, 330/286, 307; 375/345; 455/126, 128; 361/736, 760

(56) References Cited

U.S. PATENT DOCUMENTS

| | | | |
|---|---|---|---|
| 5,142,239 | * 8/1992 | Brayton et al. | 330/66 |
| 5,352,991 | * 10/1994 | Lipschultz et al. | 330/289 |
| 5,376,895 | * 12/1994 | Aihara | 330/279 |
| 5,450,046 | * 9/1995 | Kosugi et al. | 455/128 X |
| 5,530,922 | * 6/1996 | Nagode | 330/279 |
| 5,552,636 | * 9/1996 | Darveaux | 257/709 |
| 5,678,209 | * 10/1997 | Strakovsky | 455/126 |
| 5,705,940 | * 1/1998 | Newman et al. | 326/68 |
| 5,712,593 | * 1/1998 | Buer et al. | 330/129 |
| 5,901,347 | * 5/1999 | Chambers et al. | 455/234.1 |
| 5,994,965 | * 11/1999 | Davis et al. | 330/279 |
| 6,025,753 | * 2/2000 | Landherr et al. | 330/285 |
| 6,034,571 | * 3/2000 | Uno | 361/736 |
| 6,075,995 | * 6/2000 | Jensen | 361/719 |
| 6,134,110 | * 10/2000 | Langari | 361/719 |

* cited by examiner

Primary Examiner—Robert Pascal
Assistant Examiner—Khanh Van Nguyen
(74) Attorney, Agent, or Firm—Christopher J. Rourk; Akin, Gump, Strauss, Hauer & Feld, L.L.P.

(57) ABSTRACT

A single multi-layer carrier module is disclosed which carries the power amplifier components in a GSM mobile digital cellular telephone. In a first embodiment of the present invention the power amplifier and the power amplifier controller are placed upon a ceramic or laminate carrier module along with necessary connection circuitry. The carrier module is then connected to the RF board. In a second preferred embodiment of the present invention the power amplifier, the power amplifier controller and a voltage controlled oscillator are placed upon the carrier module.

20 Claims, 3 Drawing Sheets

MULTI-LAYER CARRIER MODULE FOR POWER AMPLIFIER SYSTEMS WITHIN A DIGITAL CELLULAR TELEPHONE

FIELD OF THE INVENTION

The present invention relates generally to digital wireless communication systems, and more particularly, to a power amplifier system which incorporates multiple power amplifier components upon a single carrier module attached to the RF circuit board.

BACKGROUND OF THE INVENTION

Cellular telephone systems include a central base station and multiple hand held mobile cellular phones. The first generation of mobile cellular phones were analog based systems. They were bulky, large, and heavy. Further, the analog cellular phones had limited channel capacity, in that there was one allowed transmission per channel, causing excessive interference between users and other limitations of use.

The next generation of cellular phones used digital technology. Digital technology has allowed certain digital signal processing systems and modulation or transmission techniques within the cellular environment which enable a larger channel capacity for communications along with reduced interference and lower error rates within the transmissions.

The speed with which the public accepts the transition between generations of cellular phones, including the transition from the first generation analog mobile phones to the next generation digital phones, is dependent upon certain factors including the cost of the phones, the ease with which they may be used, the transmission quality, and other features which are desired by consumers.

While the first generation analog mobile cellular phones were relatively the size of small books and difficult to carry, the next generation of digital cellular phones are comfortably pocket sized. Further, there is a continuing desire to reduce the size and cost of mobile cellular phone systems while still enabling more functionality and electronics systems within the hand-held cellular phone unit.

The standards currently used for digital cellular telephony are different throughout world. The most important current digital cellular telephone standards are IS-54B which is used in the United States, Global System for Mobile Communication (GSM) in Europe, and RCR-27 in Japan. Each of these standards include digital voice and data transmission capabilities.

Various bodies worldwide are currently developing new standards for the specification of even the next; generation of mobile cellular telecommunications systems along with their increased functionality. Services offered by current wireless mobile systems are simply telephony and voice services supported by narrowband digital networks. However, there will be a demand for higher bandwidth services as more comprehensive data and information transmission services are provided within the digital cellular network. Thus, today's wireless interface must carry narrowband services effectively while providing the flexibility to carry higher bandwidth services as the demand increases.

Representative functional elements which are currently anticipated to be included within the next generation of wireless communication networks include telephony, videotelephony, and high-speed data transmission. These services have varying and distinguishable needs, transmission characteristics and other requirements which affect the size, weight and cost of cellular technology, and specifically the mobile cellular phone unit.

FIG. 1 shows a graphical block diagram depiction of the several major subsystems within a mobile digital cellular telephone 10 used today. These subsystems include a battery pack 11, a set of user interfaces 12 (including a microphone, a speaker, a keyboard and a display), a set of digital control and/or analog device drivers 13 for the user interfaces 12, digital processing and control systems 14, a radio subsystem 15, and an antenna 16. As shown within FIG. 1, each of the subsystems within the digital cellular phone 10 are interrelated and provide power and control to each other.

The battery pack 11 initially provides power to both the digital control and analog drivers 13 and the digital processing and control systems 14. The analog drivers and control system 13 controls the user interfaces 12, as well as the radio subsystem 15 including separate components such as a power amplifier, a power amplifier controller and a voltage controlled oscillator.

The power amplifier system within the radio subsystem 15 provides output power for transmission. The radio subsystem 15 further includes a variety of passive and active RF components for transmission and reception, as well as the power amplifier for transmission through the antenna 16. These radio subsystem components are all provided on an RF board.

A common power amplifier used in this environment is an integrated circuit chip that is used within GSM digital cellular systems. This is the RI 21005 RF power amplifier available from Rockwell Semiconductor Systems, Newbury Park, Calif. The RI 21005 RF power amplifier is a compact 20 pin Thin Shrink Small Outline Package (TSSOP) surface mount GSM power amplifier operating within the 880–915 MHZ cellular band with pulsed output power up to 4 W. The output match is realized outside of the power amplifier.

A common power amplifier controller is an integrated circuit chip that is used within GSM digital cellular systems. This is the RF122 RF power amplifier controller available from Rockwell Semiconductor Systems, Newport Beach Calif. The RF122 RF power amplifier controller is an integrated, monolithic device used to control the transmitted power of MOSFET and MESFET power amplifiers. A graphical block diagram of the RF122 is shown in FIG. 2.

As shown in FIG. 2, the RF122 power amplifier controller consist of two sections: an RF detector and a gain controller. The RF122, in combination with a power amplifier, forms a power amplifier control loop where the power amplifier output power is controlled by a single analog control voltage that is input to the RF122. The RF122 consists of a logarithmic RF detector, an integrating error amplifier, a gain shaper, and D.C. bias circuitry. The RF122 device is also packaged within a 20 pin Thin Shrink Small Outline Package (TSSOP).

Within the power amplifier control loop, an RF coupler may be used at the power amplifier output in order to couple the RF output from the power amplifier to the RF logarithmic detector input. A common directional coupler known in the art is available from Murata Manufacturing Co., Ltd., Japan as part number LDC20B200H0902.

As shown within FIG. 2, the input to the logarithmic detector upon the RF122 power amplifier controller should be within the range of –40 dBm to 10 dBm. The coupled signal is fed to the input of the RF power detector on the RF122. The output from the detector is a D.C. voltage that is proportional to the RF power at the RF power amplifier output.

The integrating error amplifier amplifies and integrates the voltage difference between the detector output and the power control input. The output of the integrator is fed to the gain shaping circuit which drives the gain control input of the external RF power amplifier. The integrator in the integrating error amplifier is used to stabilize the loop. The D.C. bias circuitry provides voltage bias to the RF122.

A common Voltage Controlled Oscillator may also be provided on the RF board as an input drive to the power amplifier. The Voltage Controlled Oscillator fits within a phase locked loop at the power amplifier input, which translates the complex spectrum up to the desired channel within the transmit band. A common Voltage Controlled Oscillator used in this application is available from Murata Manufacturing Co., Ltd., Japan as part number MQE550-902.

Each of the major components in the radio subsystem, the power amplifier, the power amplifier controller, and the voltage controlled oscillator are separate components installed on the RF board which requires space, connection circuitry and cost.

OBJECTS OF THE INVENTION

It therefore is an object of the present invention to provide an improved digital cellular mobile phone which is less expensive, smaller and easier to manufacture.

It is a further object of the present invention to provide an improved digital cellular mobile phone which has an RF circuit board which is more compact and easier to assemble.

It is yet a further object of the present invention to provide an improved digital cellular mobile phone which has less separate components upon the RF circuit board.

SUMMARY OF THE INVENTION

Advantages are achieved by the present invention by providing a single multi-layer carrier module carrying the power amplifier and the power amplifier controller.

In a first embodiment of the present invention the power amplifier and the power amplifier controller are placed upon a ceramic carrier module along with necessary connection circuitry. The carrier module is then connected to the RF board.

In the first embodiment of the present invention, the power amplifier module sits upon an RF board within a GSM digital cellular telephone, the module includes (1) a power amplifier, which is a heterojunction bipolar transistor, (2) a power amplifier controller, which further includes an RF detector and a gain controller, (3) an RF coupler attached to the module, the coupler being electrically attached to an output of the power amplifier and feeding a signal to the input of the power amplifier controller, (4) few passive components to provide input and output matching for the power amplifier and the necessary supporting circuitry for the control loop, and 5) a module substrate. The power amplifier, the power amplifier controller, and the coupler are attached to the module substrate. The coupler is a directional coupler and separating a forward power from a reflected power to maintain a constant output power. The module substrate includes multiple layers, the multiple layers allowing a lattice of connection circuitry to be formed to allow the power amplifier and the power amplifier controller to communicate with each other.

In a second preferred embodiment of the present invention the power amplifier, the power amplifier controller and a voltage controlled oscillator are placed upon a ceramic or laminate carrier module along with necessary connection circuitry. The carrier module is then connected to the RF board. The second preferred embodiment is constructed similarly to the first preferred embodiment, with the exception that the voltage controlled oscillator is attached to the top surface of the module substrate. The voltage controlled oscillator is attached to the electrical input of the power amplifier to provide input drive.

Thus a compact RF circuit board in accordance with the present invention results in a digital phone which is less expensive, smaller, and easier to manufacture than prior phones.

BRIEF DESCRIPTION OF THE DRAWINGS

The features, organization, advantages and objects of this invention will be fully understood from the following detailed description and the accompanying drawings. The drawings contained herein are provided for illustrative purposes only and are to be interpreted in conjunction with the attached specification.

DETAILED DESCRIPTION OF THE INVENTION

The following description is provided to enable any person skilled in the art to make and use the invention, and sets forth the best modes presently contemplated by the inventor for carrying out this invention. Various modifications, however, will remain readily apparent to those skilled in these arts, since the generic principals of the present invention have been defined herein.

The first preferred embodiment of the present invention is a multiple layer module power amplifier circuit chip made for GSM digital cellular telephones. The multiple layer module of the first preferred embodiment contains a heterojunction bipolar transistor power amplifier and a power amplifier controller which meet the GSM specification.

Figure 1:
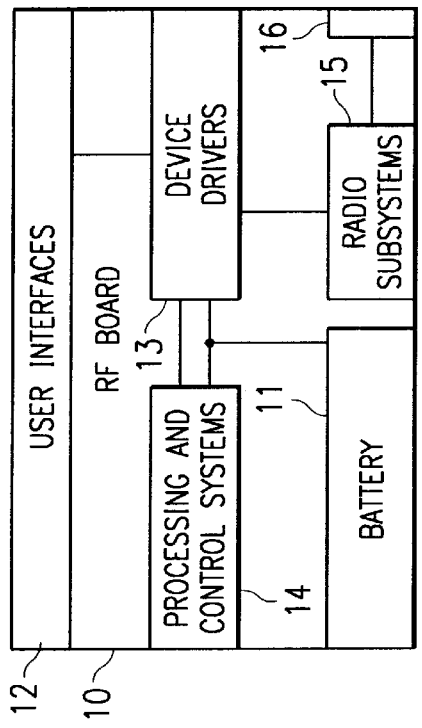
FIG. 1 shows a graphical block diagram depiction of the several major subsystems within a mobile digital cellular telephone.
Figure 2:
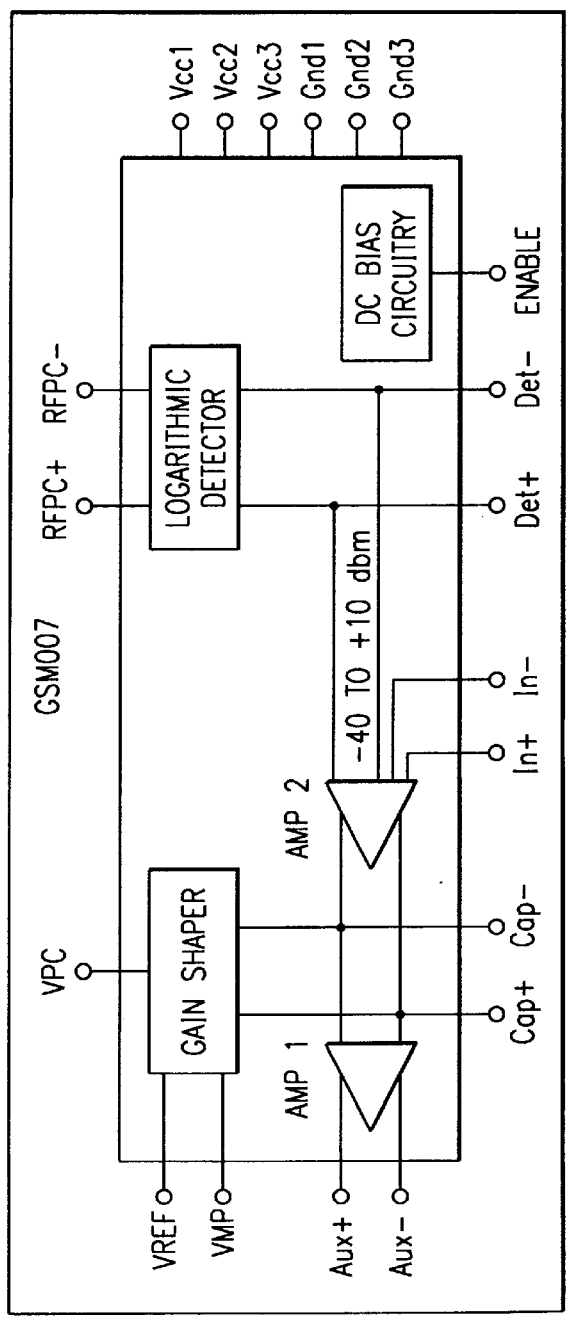
FIG. 2 shows a graphical block diagram of a common power amplifier controller known in the art.
Figure 3:
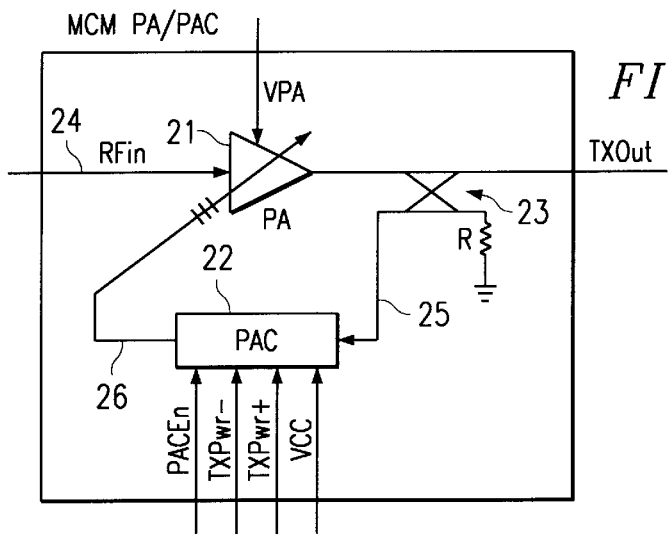
FIG. 3 shows a graphical block diagram depiction of a first preferred embodiment of the present invention.

A block diagram depiction of the first preferred embodiment of the present invention is illustrated in FIG. 3, and includes a power amplifier 21, a power amplifier controller 22 and a coupler 23. As shown FIG. 3, the power amplifier receives the digital RF input 24, and outputs a signal through the coupler 23. The power amplifier controller 22 accepts its input 25 from the coupler 23 in order to create a feed back loop input 26 to the power amplifier 21.

Figure 4:
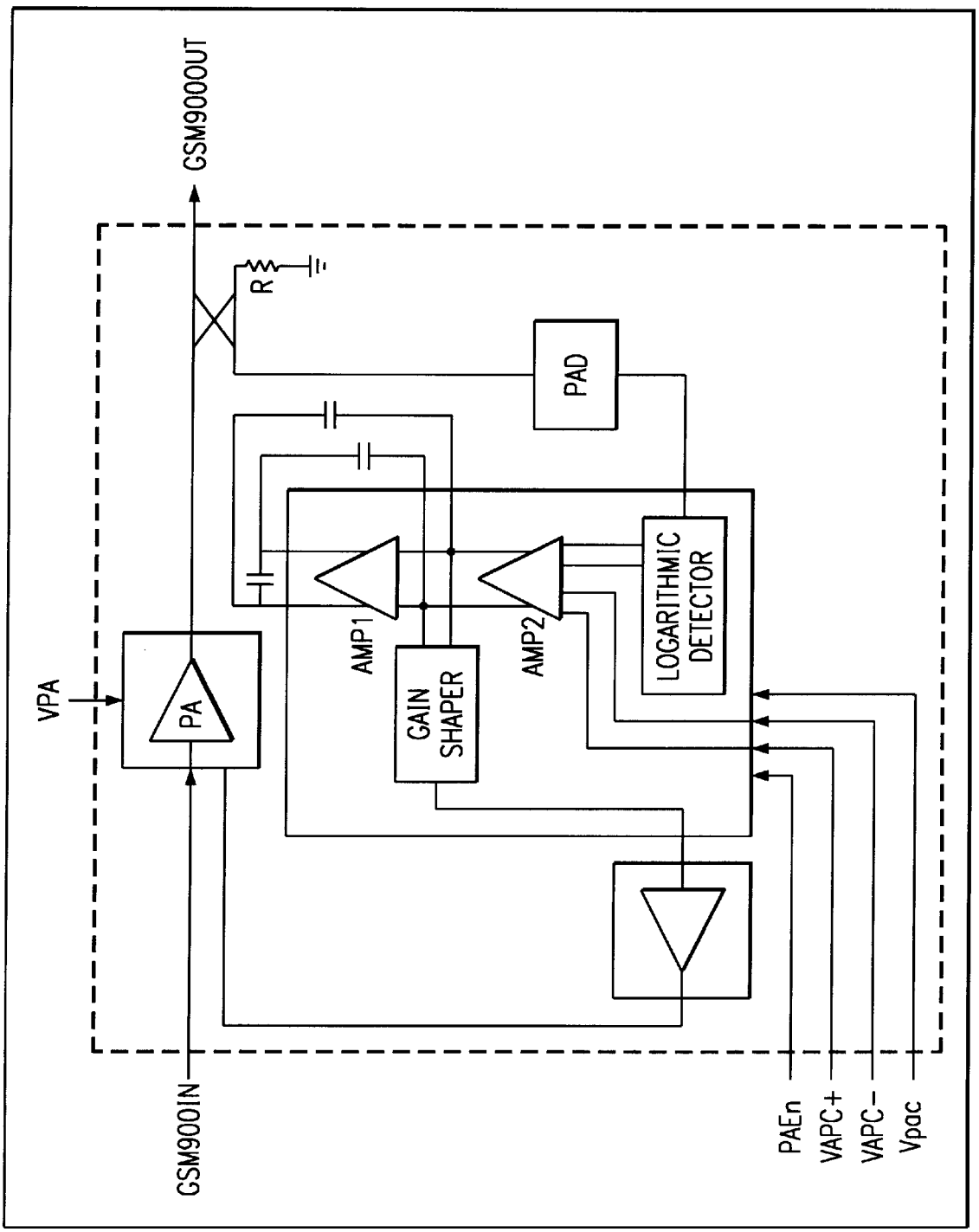
FIG. 4 shows a more detailed graphical block diagram depiction of the first preferred embodiment of the present invention shown in FIG. 3.

A more detailed block diagram of the first preferred embodiment of the present invention is shown in FIG. 4. As shown in FIG. 4, the power amplifier controller of the preferred embodiment consists of two sections: an RF detector and a gain controller (integrator). The power amplifier controller and the power amplifier form a power amplifier control loop where the power amplifier output power is controlled by a single analog control voltage.

In the event of a poor voltage standing wave ratio, the preferred embodiment to the present invention includes a built-in directional coupler which separates the forward power from the reflected power in order to maintain a constant output power. In the preferred embodiment of the present invention the power amplifier is designed with a bipolar gallium arsenide process that allows single supply operation while maintaining high efficiency and excellent dynamic range.

Figure 5:
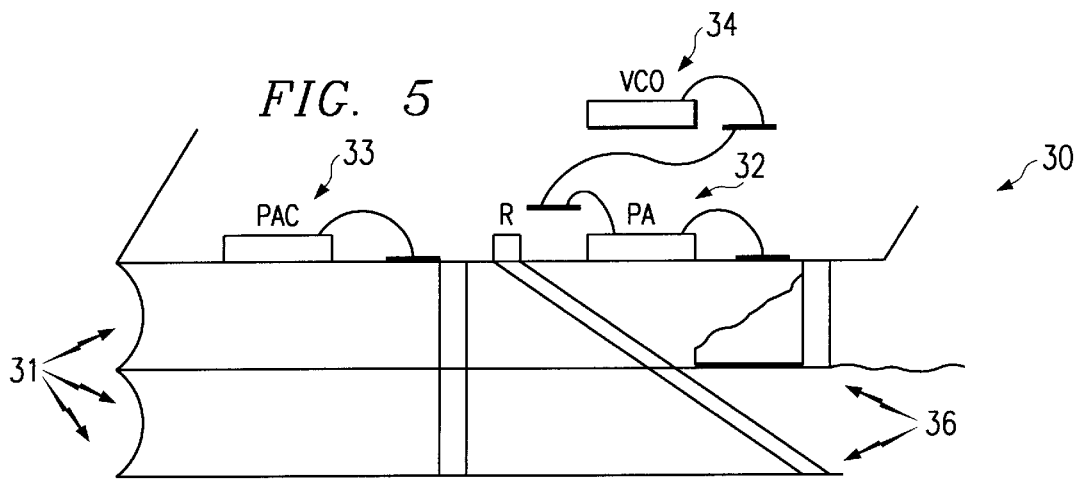
FIG. 5 shows a graphical illustration of the carrier module of the preferred embodiment of the present invention.

A graphical illustration of the carrier module of the preferred embodiment of the present invention is depicted in FIG. 5. As the shown in FIG. 5, the carrier module 30, has multiple layers 31, which allows circuitry to be inlaid to enable the various power amplifier components to electrically communicate and interact with one another.

As shown in FIG. 5, in the preferred embodiments of the present invention, the power amplifier 32, the power amplifier controller 33 and a voltage control oscillator 34 all sit upon the top layer of the multiple layer carrier module 30. A coupler is inlaid below the surface of the carrier module on other lower layers 31. Other connection circuitry is also embedded within the multiple layers of the carrier module 30. Common insulation or packaging is provided in order to protect the power amplifier components attached to the top surface of the carrier module substrate.

The carrier module of the preferred embodiment of the present invention is ceramic or laminate. In the preferred embodiment of the present invention the substrate is a B.T. laminate available from Details, Inc., Anaheim, Calif.

Figure 6:
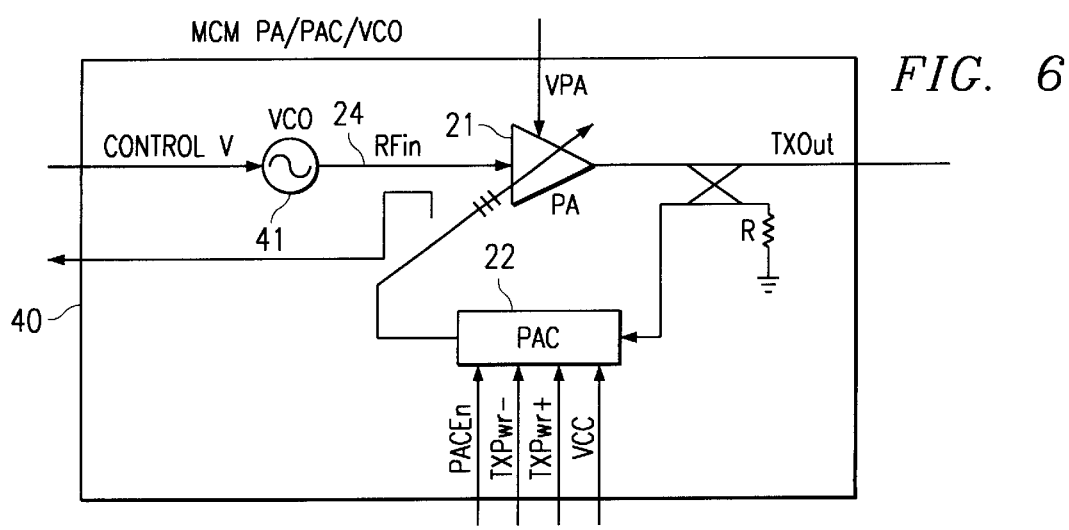
FIG. 6 shows a graphical block diagram depiction of a second preferred embodiment of the present invention.

A second preferred embodiment of the present invention is depicted in the block diagram illustration shown in FIG. 6. As shown in FIG. 6, the carrier module 40 includes the same components as the carrier module depicted in FIG. 3 along with a voltage controlled oscillator 41. The second preferred embodiment illustrated in FIG. 6 operates in the same manner as the power amplifier system illustrated in FIG. 3 with the addition that the voltage controlled oscillator 41 is integrated on the carrier module to drive the power amplifier.

Those skilled in the art will appreciate that various adaptations and modifications of the just described preferred embodiment can be used and configured without departing from the scope and spirit of the invention. Therefore, it is to be understood that, within the scope of the appended claims, the invention may be practiced other than as specifically described herein.

What is claimed is:

1. A main circuit board having a power amplifier module that comprises:
   a power amplifier;
   a power amplifier controller; and
   a module substrate, the power amplifier and the power amplifier controller attached to the module substrate, the substrate attachable to the main circuit board so as to reduce the number of components on the main circuit board.

2. The module of claim 1 wherein the power amplifier is a heterojunction bipolar transistor.

3. The module of claim 1 wherein the module meets a GSM specification.

4. The module of claim 1, further comprising an RF coupler attached to the module, the coupler being electrically attached to an output of the power amplifier.

5. The module of claim 4, wherein the coupler feeds a signal to the input of the power amplifier controller.

6. The module of claim 5, wherein the coupler is a directional coupler which separates a forward power from a reflected power to maintain a constant output power.

7. The module of claim 1, wherein the power amplifier controller further includes an RF detector and a gain controller.

8. The module of claim 1, wherein the power amplifier receives a single analog control voltage signal and the power amplifier and the power amplifier controller form a power amplifier control loop.

9. The module of claim 1, wherein the power amplifier is designed with a bipolar gallium arsenide process.

10. The module of claim 1, wherein the module substrate further comprises multiple layers, the multiple layers providing a lattice of connection circuitry to allow the power amplifier and the power amplifier controller to communicate with each other.

11. The module of claim 10, wherein the power amplifier, the power amplifier controller and voltage controlled oscillator are disposed on a top surface of the multiple layer module substrate.

12. The module of claim 10, wherein a coupler is inlaid upon the multiple layer module substrate, the coupler being inlaid upon layers of the substrate below a top layer.

13. The module of claim 10, wherein the substrate is BT laminate.

14. The module of claim 1, further comprising a voltage controlled oscillator attached to the module substrate, the voltage controlled oscillator being connected at an input to the power amplifier.

15. An RF board within a digital cellular telephone having a separately-attached power amplifier module, the power amplifier module comprising:
   a power amplifier, the power amplifier being a heterojunction bipolar transistor;
   a power amplifier controller, the power amplifier controller further including an RF detector and a gain controller,
   an RF coupler attached to the module, the coupler being electrically attached to an output of the power amplifier, the coupler feeding a signal to the input of the power amplifier controller, the coupler being a directional coupler and separating a forward power from a reflected power to maintain a constant output power; and
   a module substrate, the power amplifier, the power amplifier controller, and the coupler attached to the module substrate, the module substrate further comprises multiple layers, the multiple layers providing a lattice of connection circuitry to allow the power amplifier and the power amplifier controller to communicate with each other, the module substrate attachable to the RF board.

16. The module of claim 15, wherein the module meets a GSM specification.

17. The module of claim 15, wherein the power amplifier receives a single analog control voltage signal and the power amplifier and the power amplifier controller form a power amplifier control loop.

18. The module of claim 15, wherein the power amplifier, the power amplifier controller and a voltage controlled oscillator sit upon a top surface of the multiple layer module substrate.

19. The module of claim 15, wherein the coupler is inlaid upon the multiple layer module substrate, the coupler being inlaid upon layers of the substrate below a top layer.

20. The module of claim 15, further comprising a voltage controlled oscillator, the voltage controlled oscillator being electrically connected at an input the power amplifier, the voltage controlled oscillator being attached to the top surface of the module substrate.

* * * * *